United States Patent [19]

Burns

[11] 4,312,926
[45] Jan. 26, 1982

[54] TEAR STRIP PLANARIZATION RING FOR GANG BONDED SEMICONDUCTOR DEVICE INTERCONNECT TAPE

[75] Inventor: Carmen D. Burns, San Jose, Calif.

[73] Assignee: National Semiconductor Corporation, Santa Clara, Calif.

[21] Appl. No.: 139,934

[22] Filed: Apr. 14, 1980

[51] Int. Cl.³ .................. H01L 23/48; H01L 29/32
[52] U.S. Cl. .................................. 428/571; 428/582; 357/68; 357/69; 357/70; 357/71
[58] Field of Search .................. 357/68, 69, 70, 71; 428/571, 582

[56] References Cited

U.S. PATENT DOCUMENTS

| | | | |
|---|---|---|---|
| 3,611,061 | 10/1971 | Segerson | 428/571 |
| 3,967,366 | 7/1976 | Birglechner et al. | 357/70 |
| 4,218,701 | 8/1980 | Shirasaka | 357/70 |
| 4,258,458 | 3/1981 | Danna | 428/571 |
| 4,259,436 | 3/1981 | Tabuchi et al. | 357/70 |

*Primary Examiner*—Brooks H. Hunt

*Attorney, Agent, or Firm*—Gail W. Woodward; James A. Sheridan

[57] ABSTRACT

In an automatic assembly tape for semiconductor device assembly a continuous tape includes a plurality of sequential metal finger patterns. Each pattern includes a plurality of fingers that extend inwardly to form an array that mates with the bonding pads on a semiconductor device chip. The fingers are bonded to the chip pads so that the chip is then associated with the tape and therefore emenable to further assembly on high speed machines on a reel-to-reel tape handling basis. Each finger pattern includes an inner tear strip ring that initially holds the fingers together in a unitary structure. The fingers are joined to the ring via intermediate weakened regions. After the fingers are bonded to the chip pads, the ring is torn away so as to separate at the weakened regions. Prior to bonding, the fingers are held in precise location and in a common plane. This allows close spaced complex finger patterns and avoids bent fingers which can cause bond failure and possibly clogging of the auto assembly machines.

5 Claims, 3 Drawing Figures

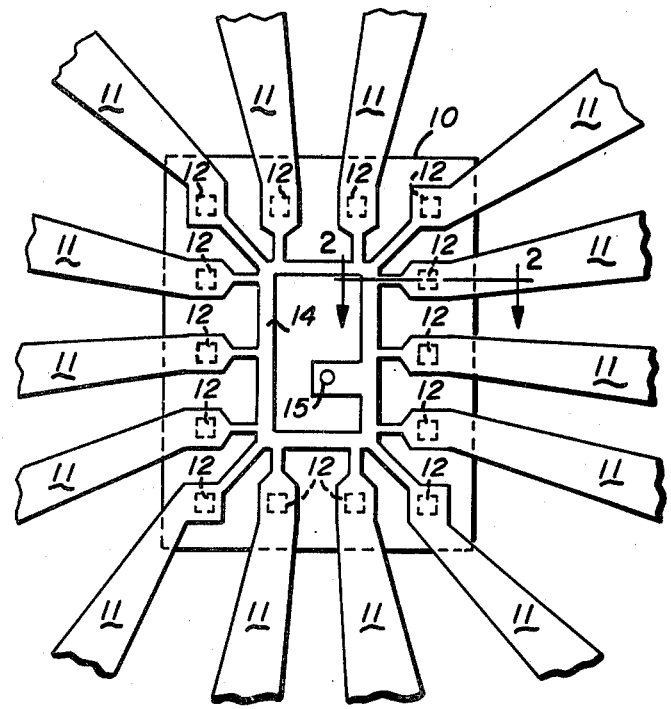
Fig_1
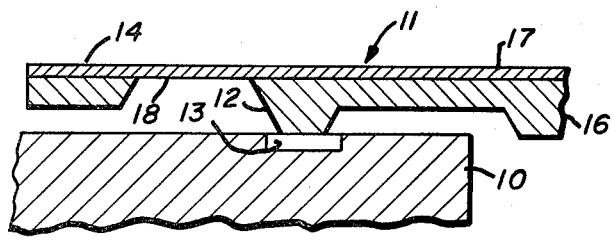
Fig_2
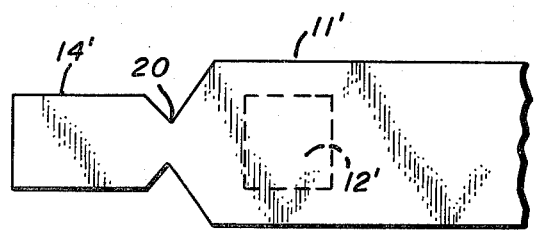
Fig_3

TEAR STRIP PLANARIZATION RING FOR GANG BONDED SEMICONDUCTOR DEVICE INTERCONNECT TAPE

BACKGROUND OF THE INVENTION

The invention relates to an improvement in automatic tape assembly of semiconductor devices. My U.S. Pat. Nos. 4,000,842 and 4,188,438 relate to such tape assembly and specifically show copper to gold themocompression (TC) gang bonding and antioxidant coating of copper parts for TC gang bonding respectively. My copending patent application 921,642 filed July 3, 1978 now abandoned, relates to bumped copper tape for conrolled collapse TC gang bonding. My copending patent application serial number 138,030 was filed April, 1980 and is titled LEAD DESIGN FOR SEMICONDUCTOR AUTOMATIC ASSEMBLY TAPE. It shows an improved lead design, how a semiconductor device is assembled to a secondary lead structure, and is incorporated herein by reference.

In the tape assembly process the throughput of devices in the automatic machines can be adversely affected by bent pattern fingers. These can act to clog the machine and disrupt its operation. Additionally, bent fingers cannot be reliably bonded. Such bent fingers are more of a problem in complex patterns where a large number of relatively slim elements are involved.

SUMMARY OF THE INVENTION

It is an object of the invention to improve the inner lead bonding in the automatic tape assembly of semiconductor devices.

It is further object of the invention to improve the planarity of the pattern fingers in an automatic semiconductor device assembly tape.

It is a still further object of the invention to hold the inner ends of the metal fingers in a planar manner and precisely in position in an automatic semiconductor device assembly tape.

It is a still further object of the invention to employ a tear strip planarization ring to hold the inner ends of the fingers in precise locations during and prior to inner lead bonding in an automatic semiconductor device assembly tape so that when the ring is removed after bonding the bonded leads are tested for bond reliability.

These and other objects are achieved as follows. In an assembly tape the finger patterns extend inwardly to form an array that mates with the bonding pads on a semiconductor chip. The fingers are bonded to the chip pads, preferably by TC gang bonding. The tape is manufactured so that each finger in a pattern is joined to a tear strip ring by means of a weakened link. Thus, the fingers of each successive pattern are held in a unitary structure in which the fingers are planar and precisely located. After the inner lead bond, which acts to associate the chip with the tape, the tear strip is ripped away. The breakage occurs at the weakened regions, thus leaving the fingers attached to the semiconductor device. The weakened regions are designed to rupture at a force level that is below that needed to remove a properly bonded finger. Thus, removal of the tear strip also subjects the bonded fingers to a limited removal force thereby automatically testing the bonds. If a finger is poorly bonded, tear strip removal will lift it from the bonding pad and render the failure immediately obvious. If the finger is properly bonded, it will not be affected by tear strip removal.

BRIEF DESCRIPTION OF THE DRAWING

FIG. 1 shows a fragment of automatic assembly tape showing a semiconductor device chip bonded to the inner ends of assembly tape fingers;

FIG. 2 is a cross-section view of a finger bonded to a semiconductor chip pad showing the construction of a weakened link; and FIG. 3 is a view of a bonded finger showing an alternative form of weakened link.

DESCRIPTION OF THE INVENTION

In FIG. 1 a segment of assembly tape is shown connected to semiconductor device chip 10. The assembly tape includes a plurality of fingers 11 that converge inwardly to create a pattern that mates with the bonding pads on chip 11. Each finger 11 has a bump on its underside indicated at 12 for the purpose of themocompression bonding to bonding pad 13. Such bonding is taught in my copending application Ser. No. 921,642 filed July 3, 1978. While not shown, the fingers 11 extend outwardly to connect to a secondary lead structure as shown in my above-identified copending application Ser. No. 138,080 filed April, 1980. The present invention is directed to the inner lead bonding and related finger structure. It is to be understood that the illustrations relate to a single such finger pattern which is located on a continuous tape that includes a sequence of many such patterns.

In accordance with the invention, each finger in a pattern is joined together to form a unitary structure by means of a tear strip 14 which contains an ear 15 useful in its removal. When the assembly tape is manufactured, the structure of FIG. 1 is created and will act effectively in two ways. First, the fingers are precisely located and held in position. It has been found that the photolithographic processing used in tape manufacture will readily yield accuracies in finger location to between 0.1 mil and 0.5 mil. Second, the structure increases the planarity of the fingers. It has been found that planarity to better than 0.5 mil is achievable. These characteristics provide for the elimination of bent fingers which can interfere seriously with automatic machine assembly. Furthermore, the precision location makes automatic assembly of slim closely spaced leads feasible. This permits automatic assembly of large scale integrated (LSI) circuit chips.

In operation the finger structure of FIG. 1 is bonded as shown to the semiconductor device chip 10, preferably by themocompression (TC) gang bonding wherein all of the fingers are bonded simultaneously. Then tear strip 14 is torn off by grasping ear 15 and pulling vertically away from chip 10. The segments that couple tear strip 14 to the individual fingers will rupture at their weakest point. It is preferred that the rupture point be controlled so as to be located at the inner ends of the fingers.

FIG. 2 is a cross section of an attached finger 11. Chip 10 is shown without surface oxide or other passivation coating for clarity. Bump 12 is TC bonded to pad 13 of chip 11. In this case the tape is of a bimetal construction. The main portion of finger 11 is copper 16 with an overcoat 17 of nickel. In the manufacture a copper tape about three mils thick is plated with nickel about 0.2 mil thick. The bimetal tape is then manufactured to create the design shown in FIG. 1. However, at the end of the finger just beyond bump 12 the copper is etched completely through to leave only a nickel web at 18. Thus, as tear strip 14 is torn off rupture will occur at 18.

If an all copper finger is to be used, the structure of finger 3 can be employed. Here all copper finger 11' is necked down at 20 just beyond bump 12' where it joins tear strip 14'. In the tape manufacture the rupture strength can be controlled by controlling the cross section at 20. In the bimetal tape of FIG. 2 the thickness of metal layer 17 will control the rupture strength.

It has been found that when copper bumped tape with a 16 square mil bond area is TC bonded to an IC pad the pull strength is between 30 and 40 grams for all of the fingers. Very few bonded fingers fail below 30 grams. Accordingly, in practicing the invention I have controlled the rupture strength at either points 18 or 20 to between 5 and 15 grams.

It is clear that as tear strip 14 is removed each finger will be subjected to a lifting force of between 5 and 15 grams. Any well-bonded fingers will be unaffected. However, if the fingers are not properly bonded, the bond will fail before the tear strip breaks away. Thus, the invention provides a very useful secondary result. The bonding operation is actively tested by tear strip removal and faulty bonds revealed immediately. The making of such a test normally can only be done on a statistical basis using ordinary prior art approaches which are destructive.

The invention has been described and two preferred embodiments disclosed. When a person skilled in the art reads the foregoing, alternatives and equivalents within the spirit and intent of the invention will occur to him. For example, bumped contact pads on the semiconductor can be employed with either bumped or flat tape fingers. Also tear strip shapes other than that shown could be used. Accordingly, it is intended that the invention be limited only by the following claims.

I claim:

1. An automatic semiconductor device assembly tape having a succession of metal finger patterns located at intervals along its length, said patterns comprising:
    a plurality of metal fingers extending inwardly to form an inner array that mates with the bonding pad pattern on a semiconductor device that will be connected thereto;
    a ring located inside said inner array and connected to said fingers by means of a plurality of links; and
    a weakened region in each of said links.

2. The tape of claim 1 wherein said weakened region is located adjacent to said inner array.

3. The tape of claim 2 wherein said weakened region has a lower rupture strength than that of said finger when bonded to said semiconductor device pad.

4. The tape of claim 3 wherein each of said fingers has a bump located at said inner array for thermocompression bonding to a pad on said semiconductor device.

5. The tape of claim 4 wherein said weakened region comprises a thin layer of metal different from the metal of said fingers and opposite said bump.

* * * * *